US010184723B2

(12) United States Patent
Yang

(10) Patent No.: US 10,184,723 B2
(45) Date of Patent: Jan. 22, 2019

(54) BLANK HEATING DEVICE

(71) Applicant: Hyundai Motor Company, Seoul (KR)

(72) Inventor: Woo Ho Yang, Incheon (KR)

(73) Assignee: Hyundai Motor Company, Seoul (KR)

(*) Notice: Subject to any disclaimer, the term of this patent is extended or adjusted under 35 U.S.C. 154(b) by 181 days.

(21) Appl. No.: 15/153,313

(22) Filed: May 12, 2016

(65) Prior Publication Data

US 2017/0106426 A1 Apr. 20, 2017

(30) Foreign Application Priority Data

Oct. 14, 2015 (KR) ........................ 10-2015-0143633

(51) Int. Cl.
*H01L 21/00* (2006.01)
*F27B 9/12* (2006.01)
*F27B 5/12* (2006.01)
*F27B 5/06* (2006.01)

(52) U.S. Cl.
CPC .................. *F27B 9/12* (2013.01); *F27B 5/12* (2013.01); *F27B 2005/062* (2013.01)

(58) Field of Classification Search
CPC ........................................................ H01L 21/00
USPC .................................................. 392/407–428
See application file for complete search history.

(56) References Cited

U.S. PATENT DOCUMENTS 4,079,919 A * 3/1978 Schober ................. C21D 1/667 134/199
4,584,465 A * 4/1986 Mathisson .............. A23L 33/40 219/383
4,764,102 A * 8/1988 Takahashi ................. B28B 3/20 219/700
4,771,929 A * 9/1988 Bahr .................... B23K 1/0053 219/85.13
4,894,517 A * 1/1990 Oguri .................... B29B 13/023 219/388
4,924,073 A * 5/1990 Chiba ..................... C30B 31/12 219/411
4,981,815 A * 1/1991 Kakoschke ......... H01L 21/2686 118/620
5,315,092 A * 5/1994 Takahashi ......... H01L 21/67115 219/121.43

(Continued)

FOREIGN PATENT DOCUMENTS

JP H05-138663 A 6/1993
JP H05-223467 A 8/1993

(Continued)

*Primary Examiner* — Michael Laflame, Jr.
(74) *Attorney, Agent, or Firm* — Mintz Levin Cohn Ferris Glovsky and Popeo, P.C.; Peter F. Corless

(57) ABSTRACT

A blank heating device having a heating furnace is provided and includes a plurality of heating members that heat a blank and a support fixture disposed within the heating furnace to support the blank. Further a transporting component is disposed beneath the support fixture and integrally displaces the support fixture and the blank to increase heating density of the blank. Consequently, a divisional heating occurs based on a size of the blank, which is a material for hot stamping, to improve heating density of the blank. Accordingly, marketability of a material is improved and a preheating time and heat loss is minimized. As a result, work convenience is improved and a consumption amount of energy is reduced.

6 Claims, 3 Drawing Sheets

(56) References Cited

U.S. PATENT DOCUMENTS

| | | | | |
|---|---|---|---|---|
| 5,766,382 | A * | 6/1998 | Hertzog | C21D 9/0018 148/656 |
| 5,994,675 | A * | 11/1999 | Bethune | H01L 21/67103 118/724 |
| 7,625,204 | B2 | 12/2009 | Katsumata | |
| 2010/0267188 | A1 * | 10/2010 | Parks | F27B 9/20 438/87 |
| 2011/0061812 | A1 * | 3/2011 | Ganguly | H01L 21/0223 156/345.34 |
| 2014/0017848 | A1 * | 1/2014 | Ragay | H05B 3/0076 438/72 |

FOREIGN PATENT DOCUMENTS

| | | | |
|---|---|---|---|
| JP | H0860371 | A | 3/1996 |
| JP | H08-128653 | A | 5/1996 |
| JP | 2007-234570 | A | 9/2007 |
| JP | 2013-057477 | A | 3/2013 |
| KR | 10-2006-0040604 | A | 5/2006 |
| KR | 10-2013-0050415 | A | 5/2013 |
| KR | 10-1376412 | B1 | 3/2014 |

* cited by examiner

BLANK HEATING DEVICE

CROSS-REFERENCE TO RELATED APPLICATION

This application is based on and claims the benefit of priority to Korean Patent Application No. 10-2015-0143633, filed on Oct. 14, 2015 in the Korean Intellectual Property Office, the disclosure of which is incorporated herein in its entirety by reference.

BACKGROUND

1. Technical Field

The present disclosure relates to a blank heating device, and more particularly, to a blank heating device that increases the marketability of a material and minimizes a preheating time and heat loss by enabling a divisional heating based on a size of a blank, which is a material for hot stamping, to improve heating density of the blank.

2. Description of Related Art

Generally, parts having various material strengths are used for a vehicle. For example, portions that absorb energy during a collision or overturn of the vehicle typically use materials that have a relatively weak strength. Conversely, a portion of a vehicle that maintains a shape to secure a survival space of a passenger during a collision typically requires an increased material strength. In particular, when the portions that should absorb energy during a collision have excessively high strength, impact energy is not sufficiently absorbed. Instead, the energy is intactly transferred to other portions of the vehicle, thereby transferring an excessive impact to the passenger and other parts of the vehicle.

Further, the vehicle manufactures are continuously attempting to reduce the weight and the cost of the vehicle. As a result, one component has heterogeneous strengths which are partially different from each other. Conventionally, a separate reinforcement member was attached to a portion that requires high strength after forming a component using a lower strength material. However, when a particular component is required to have different strengths per section, a material having high hardenability is typically used for an upper portion of the component and a material having low strength and low hardenability is used for a lower portion thereof. In other words, the two materials are welded together by laser to form a blank, and a final product is then manufactured through a hot stamping process. However, conventionally, there was a problem because the blank is heated using an indirection heating methods such as conduction and convection. A lengthy preheating time is required, and consequently, the heat loss is increased, a consumption amount of energy is increased, and work convenience is also degraded.

The above information disclosed in this section is intended merely to aid in the understanding of the background of the invention and therefore it may contain information that does not form the prior art that is already known in this country to a person of ordinary skill in the art.

SUMMARY

An aspect of the present disclosure provides a blank heating device, and more particularly, provides a blank heating device that may improve the marketability of a material and minimize (e.g., reduce) a preheating time and heat loss by enabling a divisional heating based on a size of a blank, which is a material for hot stamping, to improve heating density of the blank.

According to an exemplary embodiment of the present disclosure, a blank heating device may include a heating furnace having a plurality of heating members heating a blank; a support fixture disposed within the heating furnace to support the blank; and a transporting component disposed beneath the support fixture and may be configured to integrally displace the support fixture and the blank to increase heating density of the blank.

The heating member may include a lamp that may be configured to generate heat by near infrared ray to omni-directionally radiate the heat and a reflecting plate may be formed over (e.g., positioned above) the lamp to reflect heat radiated in an upward direction from the lamp to a downward direction. The reflecting plate may be formed in a parabolic shape. The parabolic shape may be convex in the upward direction to enable heat reflection in the downward direction. The support fixture may be formed of a ceramic material to prevent heat damage by the heating members.

In an exemplary embodiment, the heating furnace may include a plurality of cooling members that may be configured to cool the heating members. The cooling member may include a pipe coupled to an upper portion of the heating furnace to discharge compressed air through nozzles and a compressor coupled to the pipe to supply the compressed air to the pipe. The cooling member may further include a fan formed (e.g., positioned) in an interior upper surface of the heating furnace to circulate the compressed air. The heating furnace may include a first surface which is openable, and a lift that may be configured to inject or extract the blank into or from the support fixture may be included within the heating furnace.

In another aspect, the exemplary embodiment of the present disclosure, a blank heating device may include a heating furnace configured to heat a blank by a plurality of heating members including a lamp omni-directionally radiating heat by near infrared ray, and a reflecting plate disposed above the lamp to reflect heat radiated in an upward direction from the lamp to a downward direction. A support fixture may be disposed within the heating furnace to support the blank, and may be formed from a ceramic plate material, or the like to prevent heat transfer of the heating members and damage by heat of the heating members. A transporting component may be disposed beneath the support fixture and may integrally displace the support fixture and the blank to increase heating density of the blank. Further, a plurality of cooling members may be disposed within in the heating furnace to cool the heating members.

In some exemplary embodiments, the cooling member may include a pipe coupled to an upper portion of the heating furnace to discharge compressed air through nozzles. A compressor may be coupled to the pipe to supply the compressed air to the pipe. Further, a fan may be formed (e.g., disposed) in an interior upper surface of the heating furnace to circulate the compressed air. The heating furnace may include a front surface that may be configured to open. The heating furnace may further include a lift that may be configured to inject or extract the blank into or from the support fixture within the heating furnace.

BRIEF DESCRIPTION OF THE DRAWINGS

The above and other objects, features and advantages of the present disclosure will be more apparent from the following detailed description when taken in conjunction with the accompanying drawings.

DETAILED DESCRIPTION

Advantages and features of the invention and methods of accomplishing the same may be understood more readily by reference to the following detailed descriptions of exemplary embodiments and the accompanying drawings. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims The terminology used herein is for the purpose of describing particular embodiments only and is not intended to be limiting of the invention. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. As used herein, the term “and/or” includes any and all combinations of one or more of the associated listed items. For example, in order to make the description of the present invention clear, unrelated parts are not shown and, the thicknesses of layers and regions are exaggerated for clarity. Further, when it is stated that a layer is “on” another layer or substrate, the layer may be directly on another layer or substrate or a third layer may be disposed therebetween.

It is understood that the term “vehicle” or “vehicular” or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referral to herein, a hybrid vehicle is a vehicle that has two or more sources of power, for example both gasoline-powered and electric-powered vehicles.

Unless specifically stated or obvious from context, as used herein, the term “about” is understood as within a range of normal tolerance in the art, for example within 2 standard deviations of the mean. “About” can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term “about.”

Figure 1:
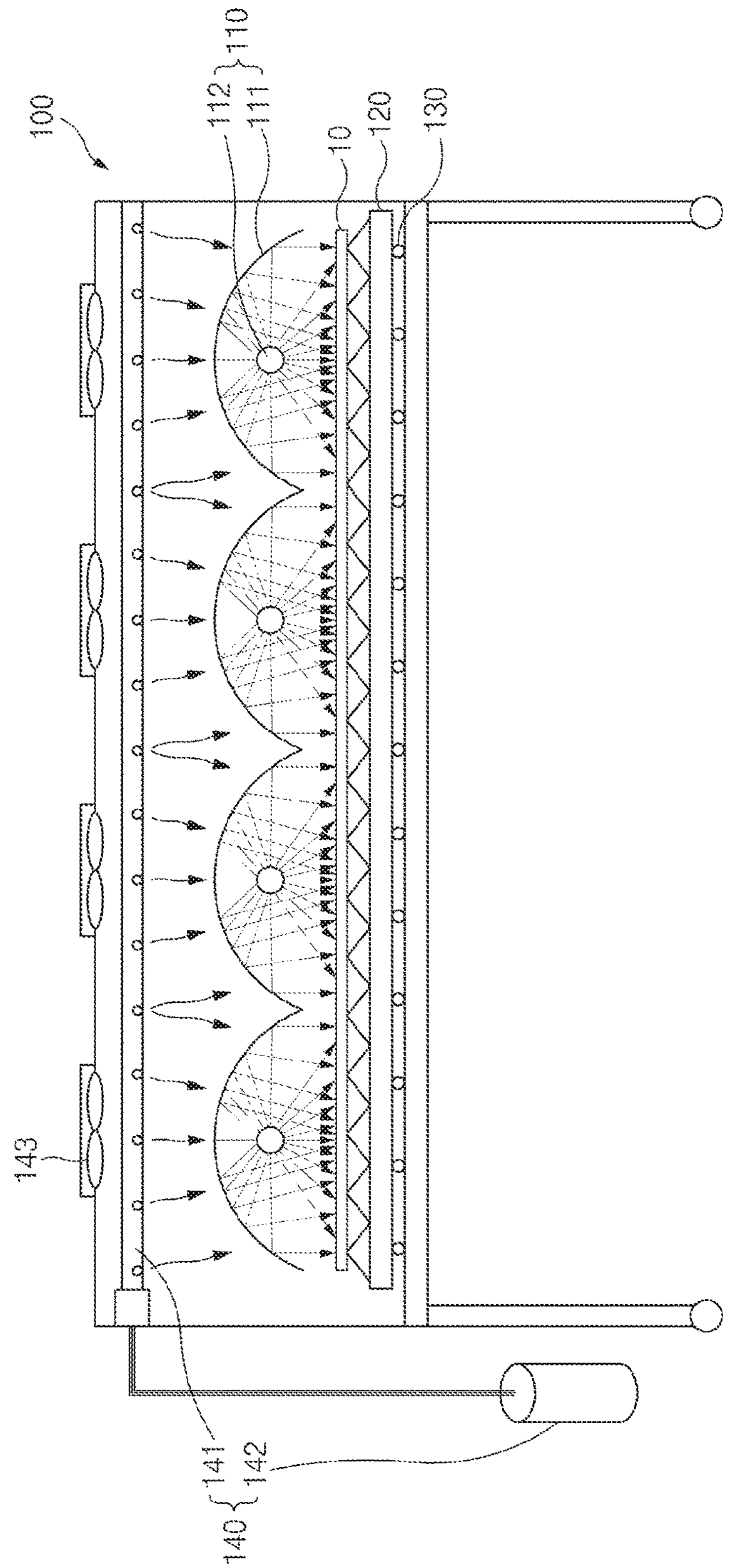
FIG. 1 is an exemplary view illustrating a blank heating device according to an exemplary embodiment of the present disclosure.
Figure 2:
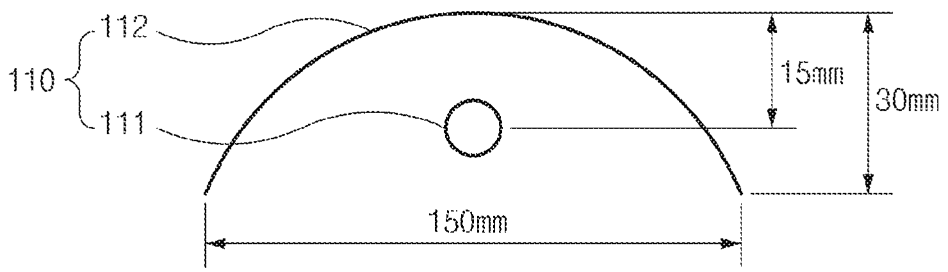
FIG. 2 is an exemplary view illustrating a heating member of the blank heating device according to an exemplary embodiment of the present disclosure.
Figure 3:
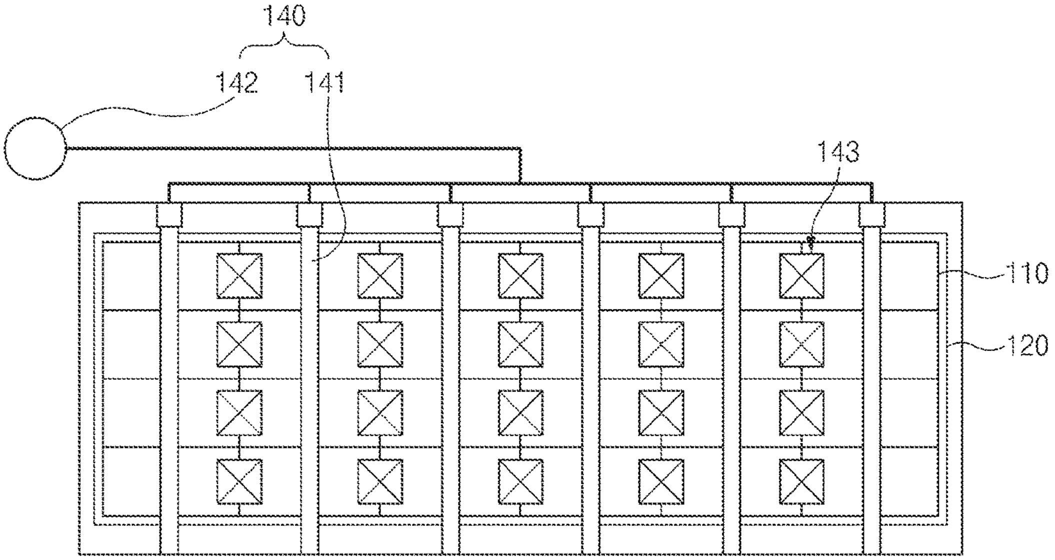
FIG. 3 is an exemplary plan view illustrating the blank heating device according to an exemplary embodiment of the present disclosure.

As illustrated in FIGS. 1 to 3, a blank heating device according to an exemplary embodiment may include a heating furnace 100 configured to heat a blank 10, a support fixture 120 configured to support the blank 10, and a transporting component 130. The transporting component may be configured to move the support fixture 120 and the blank 10 to improve heating density of the blank 10. As illustrated in FIG. 1, the heating furnace 100 that may be configured to heat the blank 10 may include a plurality of heating members 110 disposed therein to enable the blank 10 to be heated. For example, the heating member 110 may include a lamp 111 may be configured to generate heat, and a reflecting plate 112 that may be configured to reflect the generated heat toward the blank 10. The lamp 111 may be configured to generate the heat by near infrared ray and may omni-directionally radiate the heat. The reflecting plate 112 may be disposed (e.g., positioned) above the lamp 111 to reflect heat radiated in an upward direction among the heat omni-directionally radiated from the lamp 111 to a downward direction, and may improve a degree of heating of the blank 10.

As illustrated in FIGS. 1 and 2, the reflecting plate 112 may have a parabolic shape which is convex in the upward direction to enable heat reflection in the downward direction. In other words, a distance between both ends of the reflecting plate 112 may be about 150 mm. A distance between upper and lower portions thereof may be about 30 mm. Further, a distance between the upper portion of the reflecting plate 112 and the lamp 111 may be about 15 mm, to efficiently reflect the heat radiated from the lamp 111 to be transferred to the downward direction.

The support fixture 120 may be disposed within the heating furnace 100 to support the blank 10. In particular, the support fixture 120 may be formed of a ceramic material to prevent damage by the heat generated from the heating member 110. The transporting component 130 may be disposed beneath the support fixture 120 and may be configured to integrally displace the support fixture 120 and the blank in a horizontal direction for a predetermined period of time. Accordingly, the heating density of the blank 10 may be increased. In other words, according to the present disclosure, the ceramic plate support fixture 120, may be displaced in the horizontal direction by the transporting component 130 for a predetermined time to improve heating density of the components (e.g., components with lower material strength) disposed between the reflecting plates 112 formed in the parabolic shape. For example, the marketability of a material may be improved and a preheating time and heat loss may be minimized. Furthermore, the work convenience may be improved and a consumption amount of energy may be reduced In addition, according to the present disclosure, the heating furnace 100 may include a plurality of cooling members 140 that may be configured to cool the heating member 110 heated by the generated heat.

As illustrated in FIGS. 1 and 3, the cooling member 140 may include a pipe 141 that may be configured to discharge compressed air and a compressor 142 that may be configured to supply the compressed air. The pipe 141 may be coupled to an upper portion within the interior of the heating furnace 100 and may be configured to discharge the compressed air through nozzles. The compressor 142 may be disposed external to the heating furnace 100, and may be coupled to the pipe 141 to supply the compressed air to the pipe 141. In other words, the compressed air may be sprayed into the heating furnace 100 through the nozzles. Furthermore, the cooling member 140 may improve cooling speed by circulating the compressed air that may be discharged through the nozzles by fans 143 disposed within an interior upper surface of the heating furnace 100.

Moreover, the heating furnace 100 may be formed to have a first surface which may be opened, and may include a lift (not illustrated) that injects or extracts the blank 10 into and out of the support fixture 120. In other words, the blank heating device according to the present disclosure may include the heating furnace 100. Further, the heating the blank 10 having the plurality of heating members 110 may include the lamp 111 that may be configured to omni-directionally radiate the heat by near infrared ray. Further, the reflecting plate 112 may be disposed above the lamp 111 may be configured to reflect the heat radiated in the upward direction from the lamp 111 to the downward direction. The support fixture 120 may be disposed within the heating furnace 100 to support the blank 10 and may be formed of the ceramic material to prevent damage by the heat of the heating members 110. The transporting component 130 may be disposed beneath the support fixture 120 and may be configured to integrally displace the support fixture 120 and the blank 10 to increase heating density of the blank 10. The plurality of cooling members 140 may be included within the heating furnace 100 and may be configured to cool the heating members 110. Consequently, a divisional heating may occur based on a size of the blank 10, which provides the material for hot stamping, to improve heating density of the blank 10. Additionally, the marketability of a material may be improved and the preheating time and heat loss may be minimized. As a result, work convenience may be improved and the consumption amount of energy may be reduced.

As described above, according to the exemplary embodiments of the present disclosure, the blank heating device may increase marketability of the material and minimize the preheating time and heat loss by enabling the divisional heating based on the size of a blank. The blank heating device provides the material for hot stamping, to improve heating density of the blank, to thereby improve work convenience and reduce the amount of energy consumption.

Hereinabove, although the present disclosure has been described with reference to exemplary embodiments and the accompanying drawings, the present disclosure is not limited to the disclose embodiments. On the contrary, it is intended to cover various modifications and equivalent arrangements by those skilled in the art to which the present disclosure pertains without departing from the spirit and scope of the present disclosure claimed in the following claims.

What is claimed is:

1. A blank heating device, comprising:
a heating furnace that includes a plurality of heating members configured to heat a blank;
a support fixture disposed within the heating furnace to support the blank; and
a transporting component disposed beneath the support fixture and configured to integrally displace the support fixture and the blank to increase heating density of the blank,
wherein the heating member includes:
a lamp configured to generate heat by near infrared ray to omni-directionally radiate the heat; and
a reflecting plate disposed above the lamp to reflect heat radiated in an upward direction from the lamp to a downward direction, and
wherein the reflecting plate is formed in a parabolic shape which is convex in the upward direction to enable heat reflection in the downward direction,
wherein the heating furnace includes:
a plurality of pipes coupled to an upper portion of the heating furnace to discharge compressed air through nozzles and arranged in front-back direction;
a compressor coupled to the plurality of pipes to supply the compressed air to the plurality of pipes; and
a plurality of fans disposed within an interior upper surface of the heating furnace to circulate the compressed air discharged through the nozzles and arranged in the front-back direction and the left-right direction, and
wherein the plurality of fans is disposed between the plurality of pipes based on the front-back direction.

2. The blank heating device according to claim 1, wherein the support fixture is formed of a ceramic material to prevent damage by heat of the heating members.

3. The blank heating device according to claim 1, wherein the heating furnace includes a plurality of cooling members configured to cool the heating members.

4. The blank heating device according to claim 1, wherein the heating furnace includes a first surface that is openable, and a lift configured to inject or extract the blank into or from the support fixture is disposed within the heating furnace.

5. A blank heating device, comprising:
a heating furnace configured to heat a blank by including a plurality of heating members including a lamp configured to omni-directionally radiate heat by near infrared ray, and a reflecting plate disposed above the lamp to reflect heat radiated in an upward direction from the lamp to a downward direction, wherein the reflecting plate is formed in a parabolic shape which is convex in the upward direction;
a support fixture disposed within the heating furnace to support the blank, and formed of a ceramic plate material to prevent heat transfer of the heating members and damage by heat of the heating members;
a transporting component disposed beneath the support fixture and configured to integrally displace the support fixture and the blank to increase heating density of the blank; and
a plurality of cooling members disposed within the heating furnace to cool the heating members,
wherein the heating furnace includes:
a plurality of pipes coupled to an upper portion of the heating furnace to discharge compressed air through nozzles and arranged in front-back direction;
a compressor coupled to the plurality of pipes to supply the compressed air to the plurality of pipes; and
a plurality of fans disposed within an interior upper surface of the heating furnace to circulate the compressed air discharged through the nozzles and arranged in the front-back direction and the left-right direction, and
wherein the plurality of fans is disposed between the plurality of pipes based on the front-back direction.

6. The blank heating device according to claim 5, wherein the heating furnace include a first surface which is openable, and a lift configured to inject or extract the blank into or from the support fixture within the heating furnace.

* * * * *